United States Patent

[11] 3,591,853

| | | |
|---|---|---|
| [72] | Inventor | **Denis Brain Jarvis** **Eastleigh, England** |
| [21] | Appl. No. | **799,419** |
| [22] | Filed | **Feb. 14, 1969** |
| [45] | Patented | **July 6, 1971** |
| [73] | Assignee | **U.S. Philips Corporation** |
| [32] | Priority | **Feb. 16, 1968** |
| [33] | | **Great Britain** |
| [31] | | **7758/68** |

[54] FOUR PHASE LOGIC COUNTER
3 Claims, 3 Drawing Figs.

[52] U.S. Cl. ........................................................ 307/225, 307/205, 307/208, 307/214, 307/218
[51] Int. Cl. ........................................................ H03k 23/08
[50] Field of Search .......................................... 307/214, 205, 251, 279, 208, 304, 218, 220, 224, 225

[56] References Cited

UNITED STATES PATENTS

| | | | |
|---|---|---|---|
| 3,078,417 | 2/1963 | Nick | 307/224 X |
| 3,322,974 | 5/1967 | Ahrons et al. | 307/279 |
| 3,345,574 | 10/1967 | Hilberg | 307/224 X |
| 3,431,433 | 3/1969 | Ball et al. | 307/251 X |
| 3,493,785 | 2/1970 | Rapp | 307/279 |

*Primary Examiner*—John S. Heyman
*Attorney*—Frank R. Trifari

ABSTRACT: A divide by two counter using four phase logic is provided in which the counter consists of a pair of half-shift register stages. The first half-shift register stage contains the countin line for the logic signal. Each of said first and second stages is followed by an invertor; the outputs of which supplies a first and second AND gate. The outputs of said first and second stages also respectively supply said second and first AND gates; the combined outputs of the two AND gates supply a third half shift register stage. The output of said third half-shift register stage forms an output of the counter which is also fed back to the second half-shift register stage at the same time supplies an output to a third AND gate which is also connected to the countin line to provide the countout.

INVENTOR.
DENIS BRIAN JARVIS
BY
AGENT

INVENTOR.
DENIS BRIAN JARVIS
BY
AGENT

FOUR PHASE LOGIC COUNTER

The present invention concerns four phase logic systems employing metallic insulator on silicon transistors, which are also known as insulated gate field effect transistors. Transistors of this kind will hereinafter be referred to as MOST's.

The present invention is particularly concerned with a divide-by-two counter capable of being constructed as an integrated circuit.

According to the present invention there is provided a divide-by-two counter using a four phase logic system, the counter consisting of a pair of half-shift register stages to the first of which the count-in line for the logic signal is connected, each stage being followed by an inverter, the outputs of the half-stages being supplied to one "AND" gate, and the outputs of the inverters being supplied to a second "AND" gate, the combined outputs of the two "AND" gates being supplied to a third half-shift register stage the output forms the output of the counter and which is supplied to the second half-shift register stage and to an "AND" gate connected in the count-in line to provide the count-out.

One embodiment of the present invention will now be described by way of example and with reference to the accompanying drawings in which.

Figure 1:
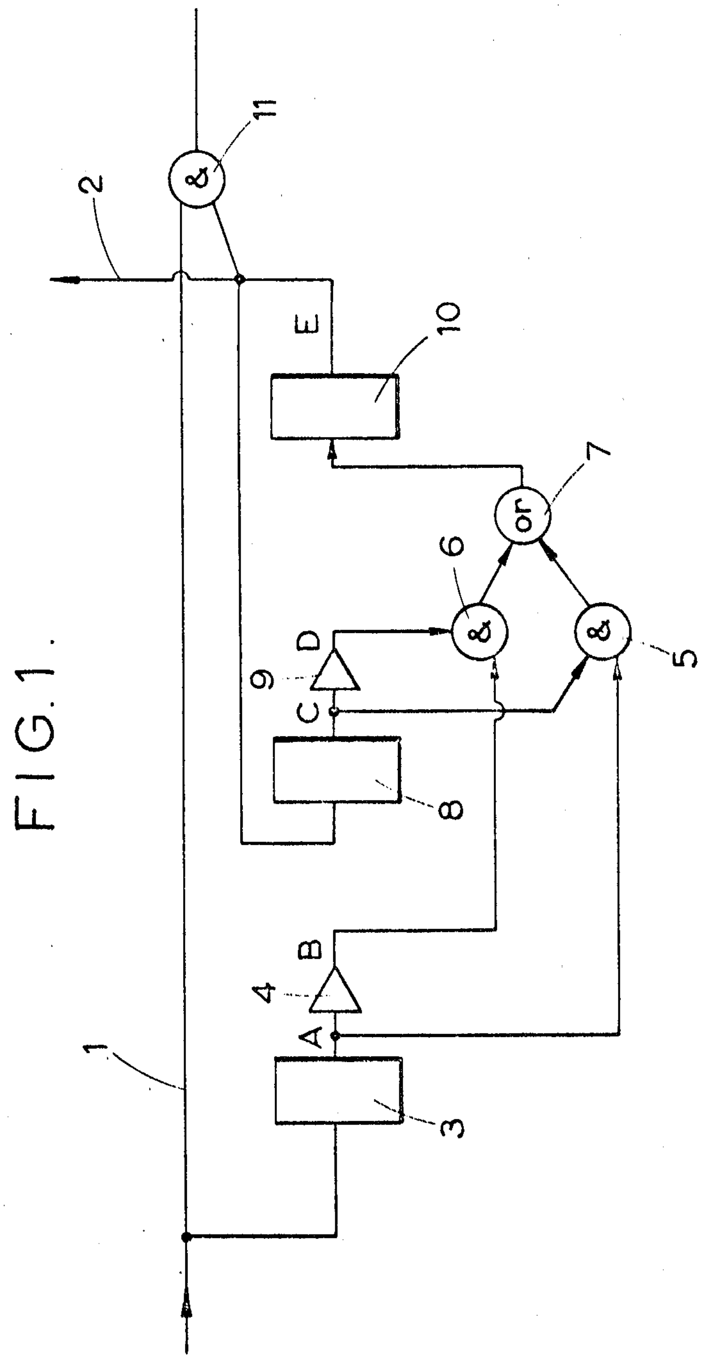
FIG. 1 is a logic diagram of a divide-by-two logic circuit constructed in accordance with the present invention.

The logic circuit shown in FIG. 1 has a count-in line 1, an output 2 and the count-out to the next stage is in fact a continuation of the line 1. The circuit includes a half-shift register stage 3, 3, the output of which is supplied to an inverter 4 and to an "AND" gate 5. The output of the inverter 4 is supplied to an "AND" gate 6, and the outputs of these two "AND" gates 5 and 6 taken to an "OR" gate 7. The remaining two inputs to the "AND" gates 5 and 6 are taken from a second half register stage 8, and the inverse of the output of the stage 8 which is supplied by an inverter 9.

The "OR" gate 7 is connected to a half register stage 10 the output of which is taken to the input of half-stage 8 and also forms the output of the divide-by-two circuit. Furthermore, the output of the half stage 10 is supplied to an "AND" gate 11 in the count line 1, and the output of this "AND" gate 11 is the count out to the next stage.

Figure 2:
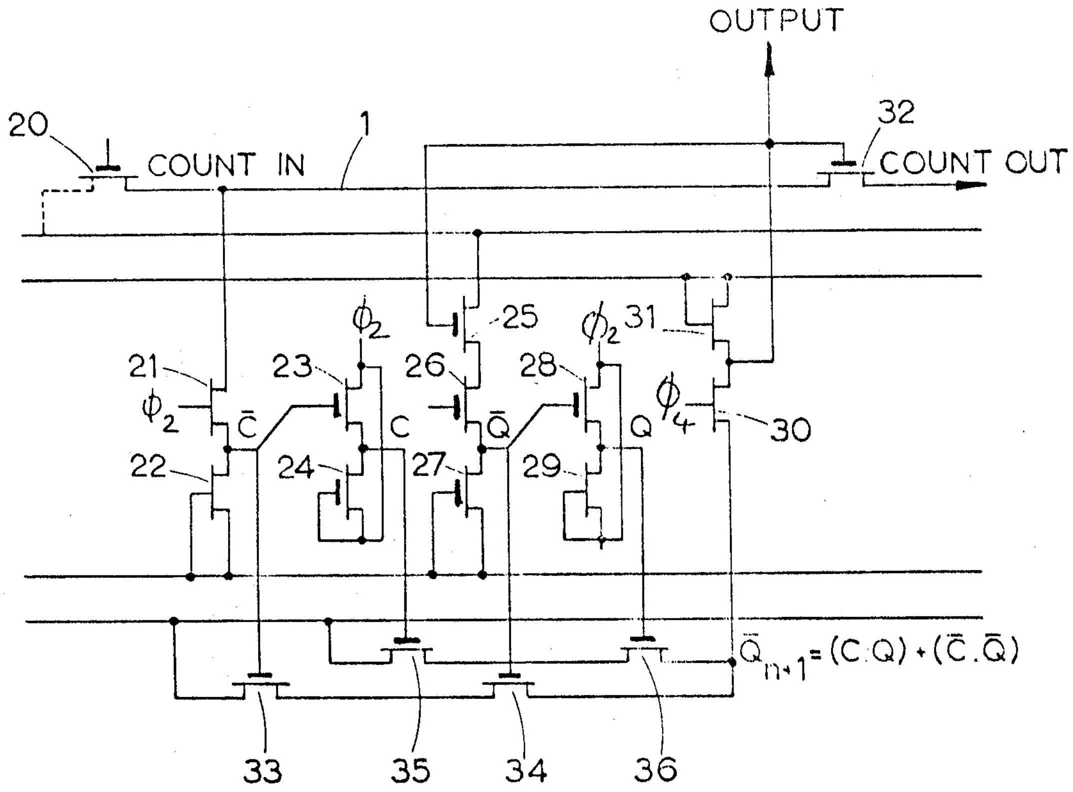
FIG. 2 is a circuit diagram of the logic circuit of FIG. 1.
Figure 3:
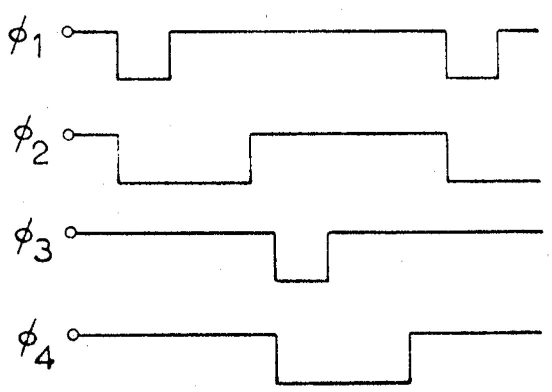
FIG. 3 is a graph showing the four-stage clock pulse cycle.

However, the logic diagram of FIG. 1 does not show how the circuit is arranged for use in four-phase logic systems, and this is shown in the more detailed circuit diagram of FIG. 2. The fundamental operation of a four-phase logic system and of the shift register which performs the basic unit of such a system is described in our copending U.S. application Ser. No. 799,441, filed Feb. 14, 1969. The half register stages 3, 8 and 10 are identical to half of the shift register described in this copending application. The present circuit uses P-channel enhancement MOST's and the clock pulse inputs to these MOST's are indicated at $\phi_1$, $\phi_2$, $\phi_3$ and $\phi_4$. As P-channel enhancement MOST's are used the clock pulses are negative, and a logical "1" at the input of a MOST is given by a negative voltage. The clock pulse cycle is shown in FIG. 3 of the accompanying drawings and the whole cycle extends between the leading edges of the $\phi_1$ clock pulses. In the specification when, for example, $\phi_1$ is referred to this means that period during which a $\phi_1$ pulse is present at the $\phi_1$ inputs.

In FIG. 1 the MOST's 20, 21 and 22 represent the half-stage shift register 3 shown in FIG. 1. The MOST's 23, 24 together form the inverter 4, whilst the MOST's 25, 26 27 are the half register stage 8. The inverter 9 is formed by the MOST's 28, 29 and the half register stage 10 is formed by the MOST's 30, 31 and 32. Finally, the "AND" gate 5 is formed by MOST's 33, 34 and the "AND" gate 6 by MOST's 35, 36. $\phi_1$, $\phi_2$, $\phi_3$ and $\phi_4$ denote the clock pulse inputs of the four-phase system.

The operation of the circuit is as follows: the logic input signal is stored on the gate capacitance of MOST 30. During $\phi_1$, the points A, B, C and D are taken to negative. Between the end of $\phi_1$ and the end of $\phi_2$ the point A is set in accordance with whether all the previous MOST's in the count line 1 are on or not. If they are all on, point A goes to "0," as MOST 2 is on. At the back end of the $\phi_2$ the point C is set as the inverse of the previous output of the circuit.

After $\phi_2$ point B is set at the inverse of point A, and point D is set at the inverse of point C.

During $\phi_3$ point E is taken negative as MOST 31 is returned on. The during the back edge of $\phi_3$ and the back edge of $\phi_4$ the output E is set to "0" if either outputs A and C are both 1, or if B and D are both 1. This is because of the MOST's 33, 34, 35 and 36 acting as "AND" gates. Thus if one of the MOST's 33, 34 is turned off by reason of a "0" at its gate electrode, then whatever the condition of the other MOST's the path for the passage of a signal is blocked.

If neither B and D, or A and C are both 1, then output E remains negative. This means that the MOST 32 is turned on, and the chain of MOST's in the count-in line 1 is continued.

The MOST's 20 and 32 in the line 1, together acts as the third "AND" gate 11, showing the logic diagram of FIG. 1.

It should be realized that alternative forms of inverters may be used, and that an actual circuit will require direct set and direct reset connections.

The circuit has the advantage that when it forms part of a chain of similar counters, after every clock pulse cycle, each counter in the chain gives an individual output in parallel with the other counters.

The circuit may alternatively use N-channel enhancement MOST's and in this case the pulse polarities are reversed.

I claim:

1. A four phase binary counter stage having input, output, and carry count-out terminals, comprising a first half-shift register stage connected to the input terminal of the counter stage for storing a logical zero in response to the concurrence of a first signal on the input terminal of the counter stage indicating that all lower significant stages are in a logical one state and a first phase of a four phase clock signal and for storing a logical zero in response to the concurrence of the first phase of the clock signal and a second signal on the input terminal of the binary counter stage indicating that at least one of the lower significant stages is in the zero state, a second half-shift register stage connected to the output terminal of the counter stage for storing the inverse of the logical state of the counter stage in response to the second phase of the clock signal, a separate inverter connected to each of the first and second half-shift register stages for providing an output corresponding to the inverse of the state of the associated half-shift register stage in response to the termination of the second phase of the clock signal, a first "AND" gate connected to the outputs of each of the separate inverters for providing an output in response to the concurrence of a first output from both inverters and the third phase of the clock signal, a second "AND" gate for providing an output in response to the concurrence of the first logic state of both the first and second half-shift register stages and the third phase of the clock signal, a third half-shift register stage connected to both the first and the second "AND" gates for storing a logical zero in response to an output from either "AND" gate and the third phase of the clock signal and for storing a logical zero in response to a concurrence of the third phase of the clock signal and the absence of an output from both the first and the second "AND" gates, means connecting the stored output of the third half-stage shift register to the output terminal of the counter stage, a third "AND" gate connected to the third half-shift register stage and to the input terminal of the counter stage for providing an output in response to a concurrence of the first signal on the input terminal of the counter stage and the one state of the third half-stage shift register, and means for connecting the output of the third "AND" gate to the carry count-out terminal of the counter stage.

2. A counter as claimed in claim 4, wherein each of the half-shift registers consist of three MOST's, the input signal to each half-shift register being stored on the gate capacitance of an input MOST.

3. A counter as claimed in claim 2, wherein the two "AND" gates to which the respective outputs from the first two half-shift stages and their associated inverters are supplied each consist of a pair of MOST's with their drain and source electrodes connected in series.